US009190371B2

(12) United States Patent
Kim

(10) Patent No.: US 9,190,371 B2
(45) Date of Patent: Nov. 17, 2015

(54) SELF-ORGANIZING NETWORK WITH CHIP PACKAGE HAVING MULTIPLE INTERCONNECTION CONFIGURATIONS

(76) Inventor: Moon J. Kim, Wappingers Falls, NY (US)

( * ) Notice: Subject to any disclaimer, the term of this patent is extended or adjusted under 35 U.S.C. 154(b) by 127 days.

(21) Appl. No.: 12/974,165

(22) Filed: Dec. 21, 2010

(65) Prior Publication Data

US 2012/0153450 A1    Jun. 21, 2012

(51) Int. Cl.
*H01L 23/02* (2006.01)
*H01L 23/00* (2006.01)
*H01L 25/065* (2006.01)
*H01L 23/48* (2006.01)
(Continued)

(52) U.S. Cl.
CPC ............... *H01L 24/06* (2013.01); *H01L 24/14* (2013.01); *H01L 25/0652* (2013.01); *H01L 25/0657* (2013.01); *H01L 23/481* (2013.01); *H01L 23/525* (2013.01); *H01L 23/5283* (2013.01); *H01L 2224/0401* (2013.01); *H01L 2224/0557* (2013.01); *H01L 2224/06181* (2013.01); *H01L 2224/06188* (2013.01); *H01L 2224/13025* (2013.01); *H01L 2224/14183* (2013.01); *H01L 2224/16137* (2013.01); *H01L 2224/16146* (2013.01); *H01L 2224/16157* (2013.01); *H01L 2225/06513* (2013.01); *H01L 2225/06517* (2013.01); *H01L 2225/06541* (2013.01); *H01L 2225/06551* (2013.01); *H01L 2225/06565* (2013.01); *H01L 2924/00014* (2013.01); *H01L 2924/014* (2013.01); *H01L 2924/01005* (2013.01); *H01L 2924/01006* (2013.01); *H01L 2924/01019* (2013.01); *H01L 2924/01029* (2013.01); *H01L 2924/01033* (2013.01); *H01L 2924/01075* (2013.01); *H01L 2924/01082* (2013.01); *H01L 2924/10253* (2013.01); *H01L 2924/351* (2013.01)

(58) Field of Classification Search
CPC ................. H01L 25/0657; H01L 2225/06551; H01L 2225/06527; H01L 2225/06513
USPC .................................. 257/778, 779, 773–776
See application file for complete search history.

(56) References Cited

U.S. PATENT DOCUMENTS 5,466,634 A * 11/1995 Beilstein et al. ................ 438/15
6,287,949 B1 * 9/2001 Mori et al. ..................... 438/612
(Continued)

*Primary Examiner* — Mark Tornow
*Assistant Examiner* — Abbigale Boyle
(74) *Attorney, Agent, or Firm* — Madeline F. Schiesser; Keohane & D'Alessandro, PLLC

(57) ABSTRACT

In general, embodiments of the present invention provide a chip package with multiple TSV configurations. Specifically, the chip package typically includes a backend layer (e.g., metal interconnect layer); a substrate coupled to the backend layer; a set (at least one) of backend side interconnects extending (e.g., angularly) from a side surface of the backend layer to a bottom surface of the backend layer; a set of optional vertical TSVs extending from a top surface of the backend layer through the substrate; and a network organizer positioned in the substrate organizer for handling communications made using the set of backend side interconnects and the set of vertical TSVs. A set of connections (e.g., controlled collapse chip connections (C4s) can be positioned adjacent to any of the vias to provide connectively to other hardware elements such as additional chip packages, buses, etc. Among other things, the use of backend side interconnects allows maximum surface area of the chip package to be utilized and provides increased reliability. These advantages are especially realized when used in conjunction with vertical TSVs.

8 Claims, 11 Drawing Sheets

(51) Int. Cl.
  *H01L 23/525* (2006.01)
  *H01L 23/528* (2006.01)

(56) References Cited

U.S. PATENT DOCUMENTS

| | | | |
|---|---|---|---|
| 6,908,785 B2 | 6/2005 | Kim | |
| 7,091,592 B2 | 8/2006 | Chen et al. | |
| 7,564,115 B2 | 7/2009 | Chen et al. | |
| 7,576,435 B2 * | 8/2009 | Chao | 257/778 |
| 7,633,165 B2 | 12/2009 | Hsu et al. | |
| 7,670,950 B2 | 3/2010 | Richardson et al. | |
| 7,683,459 B2 | 3/2010 | Ma et al. | |
| 7,776,741 B2 | 8/2010 | Reid et al. | |
| 7,838,967 B2 | 11/2010 | Chen | |
| 8,103,996 B2 * | 1/2012 | Kariat et al. | 716/100 |
| 8,299,592 B2 * | 10/2012 | Suh et al. | 257/686 |
| 2002/0017719 A1 * | 2/2002 | Taniguchi et al. | 257/723 |
| 2003/0192171 A1 * | 10/2003 | Fey et al. | 29/724 |
| 2009/0102021 A1 | 4/2009 | Chen et al. | |
| 2009/0267194 A1 | 10/2009 | Chen | |
| 2009/0319965 A1 | 12/2009 | Kariat et al. | |
| 2009/0321939 A1 | 12/2009 | Chandrasekaran | |
| 2010/0013512 A1 | 1/2010 | Hargan et al. | |
| 2010/0123241 A1 * | 5/2010 | Shi et al. | 257/698 |
| 2010/0153043 A1 | 6/2010 | Su et al. | |
| 2010/0171223 A1 | 7/2010 | Kuo et al. | |
| 2010/0178766 A1 | 7/2010 | Andry et al. | |
| 2010/0182040 A1 | 7/2010 | Feng et al. | |
| 2010/0187694 A1 | 7/2010 | Yu et al. | |

* cited by examiner

SELF-ORGANIZING NETWORK WITH CHIP PACKAGE HAVING MULTIPLE INTERCONNECTION CONFIGURATIONS

TECHNICAL FIELD

The present invention relates to networks and chip packages. Specifically, the present invention relates to a self-organizing network with a 3-dimensional (3D) chip package having backend side interconnects and/or through silicon vias (TSVs).

BACKGROUND OF THE INVENTION

In electronics, a through silicon via (TSV) is a vertical electrical connection (via) passing completely through a silicon wafer or die. TSV technology is important in creating 3D packages and 3D integrated circuits. A 3D package (System in Package, Chip Stack MCM, etc.) contains two or more chips (integrated circuits) stacked vertically so that they occupy less space. An alternate type of 3D package can be where ICs are not stacked but a carrier substrate containing TSVs is used to connect multiple ICs together in a package. In most 3D packages, the stacked chips are wired together along their edges; this edge wiring slightly increases the length and width of the package and usually requires an extra "interposer" layer between the chips.

In some new 3D packages, TSVs replace edge wiring by creating vertical connections through the body of the chips. The resulting package has no added length or width. Because no interposer is required, a TSV 3D package can also be flatter than an edge-wired 3D package. This TSV technique is sometimes also referred to as TSS (Through-Silicon Stacking or Thru-Silicon Stacking). A 3D integrated circuit (3D IC) is a single integrated circuit built by stacking silicon wafers and/or dies and interconnecting them vertically so that they behave as a single device. By using TSV technology, 3D ICs can pack a great deal of functionality into a small "footprint." In addition, critical electrical paths through the device can be drastically shortened, leading to faster operation.

In conventional semiconductor chips, ICs are formed along active surfaces of the semiconductor chips with conventional electrical terminals such as bonding pads formed on the active surface. In high-density electrical interconnections, 3D chip stacking was developed with electrical terminals not only disposed on the active surfaces but also on the corresponding back surfaces of the semiconductor chips. TSV is the enabled technology to vertically stack several chips to assemble 3D chip stacking packages or modules with high powers, high densities, and smaller dimensions. TSV's are electrically-conductive through holes inside a chip penetrating through the top surface and the bottom surface of a chip to create vertical electrical connections without any interposers nor bonding wires. TSV provides directly vertical electrical connections not go through the sidewalls at the edges of the chips to shorten the electrical paths. TSV technology can further enhance the integration and the performance of an electronic device to greatly reduce the packaging heights and dimensions, to increase the speeds, and to decrease the power consumption of an electronic device. However, each chip will generate heat during operation. Therefore, the induced thermal stresses will cause the chip to deform and even to break the electrical connections of TSV where stresses are concentrated.

U.S. Pat. No. 7,091,592 discloses a semiconductor chip. However, when the chip experiences thermal stresses causing deformation, the electrical connections formed by stud bumps located between the chips can be broken due to thermal stresses leading to electrical failure.

U.S. Pat. No. 7,838,967 discloses a semiconductor. However, the design proposed therein fails to maximize the full area of the semiconductor, or to account for failure of TSVs. As such, reliability remains a concern in U.S. Pat. No. 7,838,967.

U.S. Patent Application 20100182040 discloses programmable and non-programmable TSV in silicon chips. Metal/Insulator/Metal structures are used to switch programmable TSVs between open and shorted conditions while programming is conducted by complementary circuitry on two adjacent chips in a multi-story chip stack.

U.S. Patent Application 20100153043 discloses a TSV monitoring method through the use of inverters, connecting the inverters with the TSV circuit, enabling the circuit to oscillate, measuring the output signal on the inverter output, and determining the characteristics of TSVs based upon the output signal.

U.S. Patent Application 20100013512 discloses an electronic apparatus, systems, and methods to test and/or replace defective TSVs. Repeated measurement tests are conducted to infer an aging rate or failure rate.

U.S. Pat. No. 7,776,741 discloses a semiconductor electroplating process for depositing copper into through silicon via holes in a substantially void free filling.

U.S. Pat. No. 7,683,459 discloses a bonding method for TSV based wafer stacking. Patterned adhesive layers are utilized to join together wafers in the stack and solder bonding is used to electrically connect through the vias.

U.S. Pat. No. 7,670,950 discloses a method for metalizing a TSV feature in an IC device substrate. The method utilizes an electrolytic copper deposition immersion in a solution of copper ions and an organic sulfonic acid, or inorganic acid, or one or more organic compounds.

U.S. Pat. No. 7,564,115 discloses a TSV structure being tapered, with a hard mask region extending from the top surface, encircling a top portion of the TSV, dielectric layers over the substrate, and a metal post extending from the top surface of the dielectric layer to the TSV.

U.S. Patent Application 20100178766 discloses a high-yield method of exposing and contacting TSV structures. The electrical vias have conductive cores with surrounding insulator adjacent side and end regions of the cores.

U.S. Patent Application 20090319965 discloses a method and apparatus for thermal analysis of through-silicon via structures in an integrated circuit design layout. This invention is part of the larger IC design layout verification and qualification modeling that takes place before physical manufacturing.

U.S. Patent Application 20090267194 discloses a semiconductor chip. Higher production yields of TSV containing devices is the objective of this invention through the use of extruded rings features.

U.S. Patent Application 20100123241 discloses a semiconductor multi-chip packaging comprised of through-silicon via and a sidewall pad.

U.S. Patent Application 20090321939 discloses an integrated circuit bridge interconnect system with side-by-side die configurations that are electronically connected to each other by a bridge die with TSV connections from the bridge die to the first and second die in the side-by-side die configuration.

U.S. Patent Application 20090102021 discloses an integrated circuit structure with TSV structures with a TSV pad spaced apart from the TSV and a metal line over, and connecting, the TSV and the TSV pad.

U.S. Patent Application 20100187694 discloses a system and method for an improved through-silicon via structure. A low-K dielectric layer if formed on the sidewalls of the traditional vertical through silicon substrate via structure.

U.S. Patent Application 20100171223 discloses a TSV manufacturing process that creates TSVs with scalloped surface inner sidewalls. Additionally, the TSV structures may be sloped with either the circuit side or the backside openings having the larger via critical dimension.

SUMMARY OF THE INVENTION

In general, embodiments of the present invention provide a chip package with multiple interconnection configurations. Specifically, the chip package typically includes a backend layer (e.g., metal interconnect layer); a substrate coupled to the backend layer; a set (at least one) of backend side interconnects extending (e.g., angularly) from a side surface of the backend layer to a bottom surface of the backend layer; a set of optional vertical TSVs extending from a top surface of the backend layer through the substrate; and a network organizer positioned in the substrate organizer for handling communications made using the set of backend side interconnects and the set of vertical TSVs. A set of connections (e.g., controlled collapse chip connections (C4) can be positioned adjacent to any of the vias to provide connectively to other hardware elements such as additional chip packages, busses, etc. Among other things, the use of backend side interconnects allows maximum surface area of the chip package to be utilized and provides increased reliability. These advantages are especially realized when used in conjunction with vertical TSVs.

A first aspect of the present invention provides a chip package comprising: a backend layer; a substrate coupled to the backend layer; and a set of backend side interconnects angularly extending from a side surface of the backend layer to a bottom surface of the backend layer.

A second aspect of the present invention provides a chip package comprising: a backend layer; a substrate coupled to the backend layer; a set of backend side interconnects extending from a side surface of the backend layer to a bottom surface of the backend layer; a set of vertical TSVs extending from a top surface of the backend layer through the substrate; and a network organizer for handling communications made using the set of backend side interconnects and the set of vertical TSVs.

A third aspect of the present invention provides a method for manufacturing a chip package comprising: providing a backend layer; coupling a substrate to the backend layer; and providing a set of backend side interconnects extending from a side surface of the backend layer through a bottom surface of the backend layer.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION OF THE INVENTION

For convenience, the Detailed Description of the Invention has the following sections:

I. General Description
   II. Self-Organizing Network
   III. Redundant Interconnections
     A. Backend side interconnects
     B. Hybrid TSVs
I. General Description Illustrative embodiments will now be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

As indicated above, embodiments of the present invention provide a chip package with multiple interconnection configurations. Specifically, the chip package typically includes a backend layer (e.g., metal interconnect layer); a substrate coupled to the backend layer; a set (at least one) of backend side interconnects extending (e.g., angularly) from a side surface of the backend layer to a bottom surface of the backend layer; a set of optional vertical TSVs extending from a top surface of the backend layer through the substrate; and a network organizer positioned in the substrate organizer for handling communications made using the set of backend side interconnects and the set of vertical TSVs. A set of connections (e.g., controlled collapse chip connections (C4) can be positioned adjacent to any of the vias to provide connectively to other hardware elements such as additional chip packages, buses, etc. Among other things, the use of backend side interconnects allows maximum surface area of the chip package to be utilized and provides increased reliability. These advantages are especially realized when used in conjunction with vertical TSVs.

Figure 1:
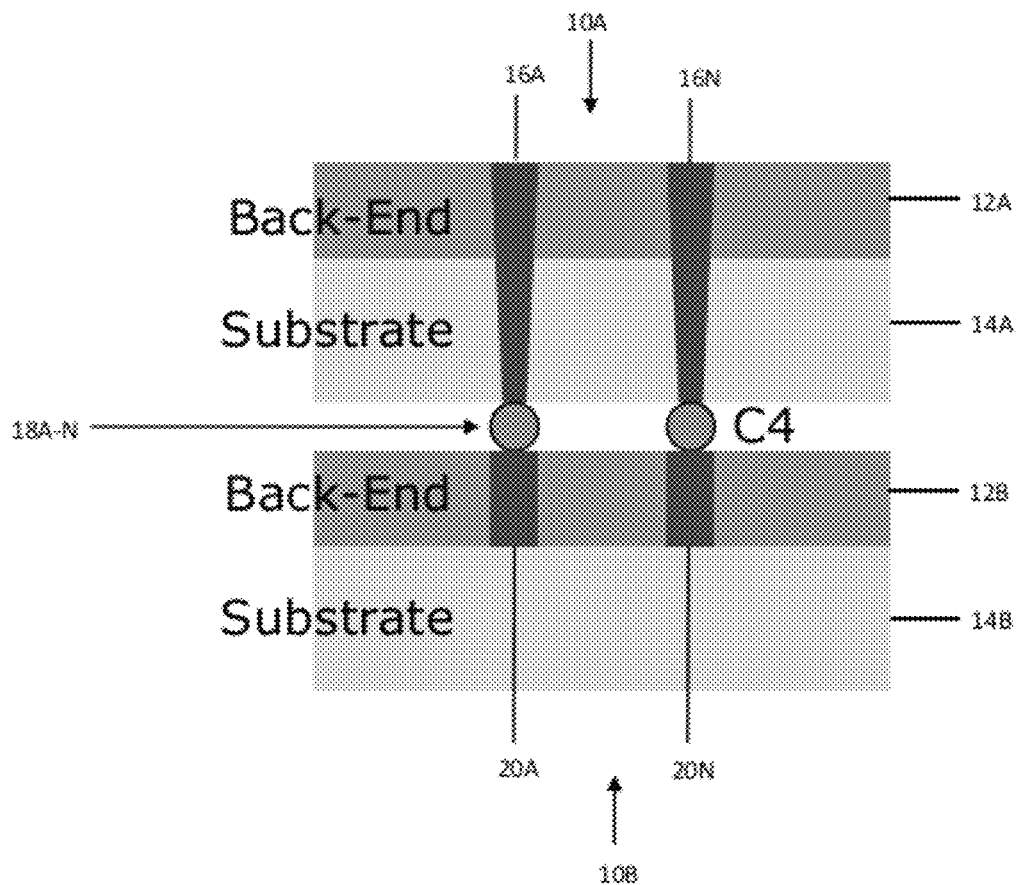
FIG. 1 depicts a TSV technique.

Referring now to FIG. 1, chip packages 10A-B are shown as connected via C4 connections 18A-N. As depicted, chip packages 10A-B each comprise a backend layer (backend metal interconnect layer) 12A-B, and a substrate (e.g., silicon) 14A-B. As further shown, chip package 10A includes a set of TSVs 16A-N extending from a top surface of backend layer 12A through substrate 14A. Opposing TSVs 16A-N on chip package 10B are (backend top) interconnects/vias 20A-N. Although only shown as penetrating backend layer 12B, interconnects/vias 20A-N could be TSVs that extend through substrate 14B. This would allow connectivity to a third chip package (not shown). As will be further described below, these concepts will be harnessed to alleviate chip failure and improve chip yield.

Figure 2:
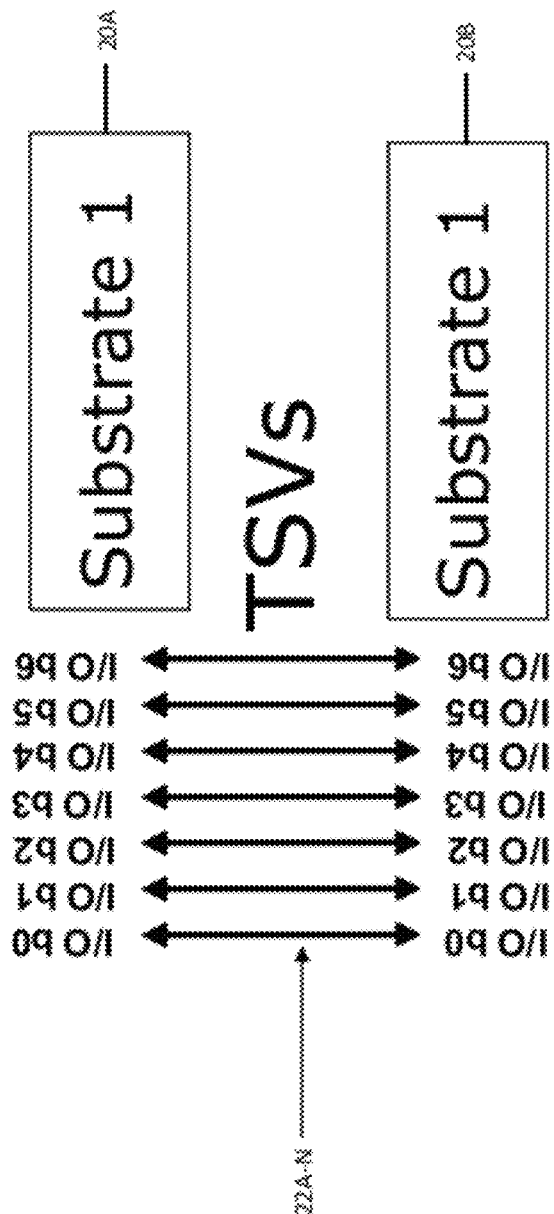
FIG. 2 depicts chip stacking with TSVs.

Referring now to FIG. 2, chip tacking using TSVs is shown in greater detail. Specifically, FIG. 2 depicts substrates 20A-B (which are part of separate chip packages not shown) which are interconnected to one another via TSVs 22A-N. In general, each TSV 22A-N is mapped as pin-to-pin connections. Unfortunately, without TSV redundancy (as provided by the present invention), such an arrangement could be subject to yield failure even with a minor TSV abnormality. TSV redundancy such as that provided herein would improve the yield.

Figure 3:
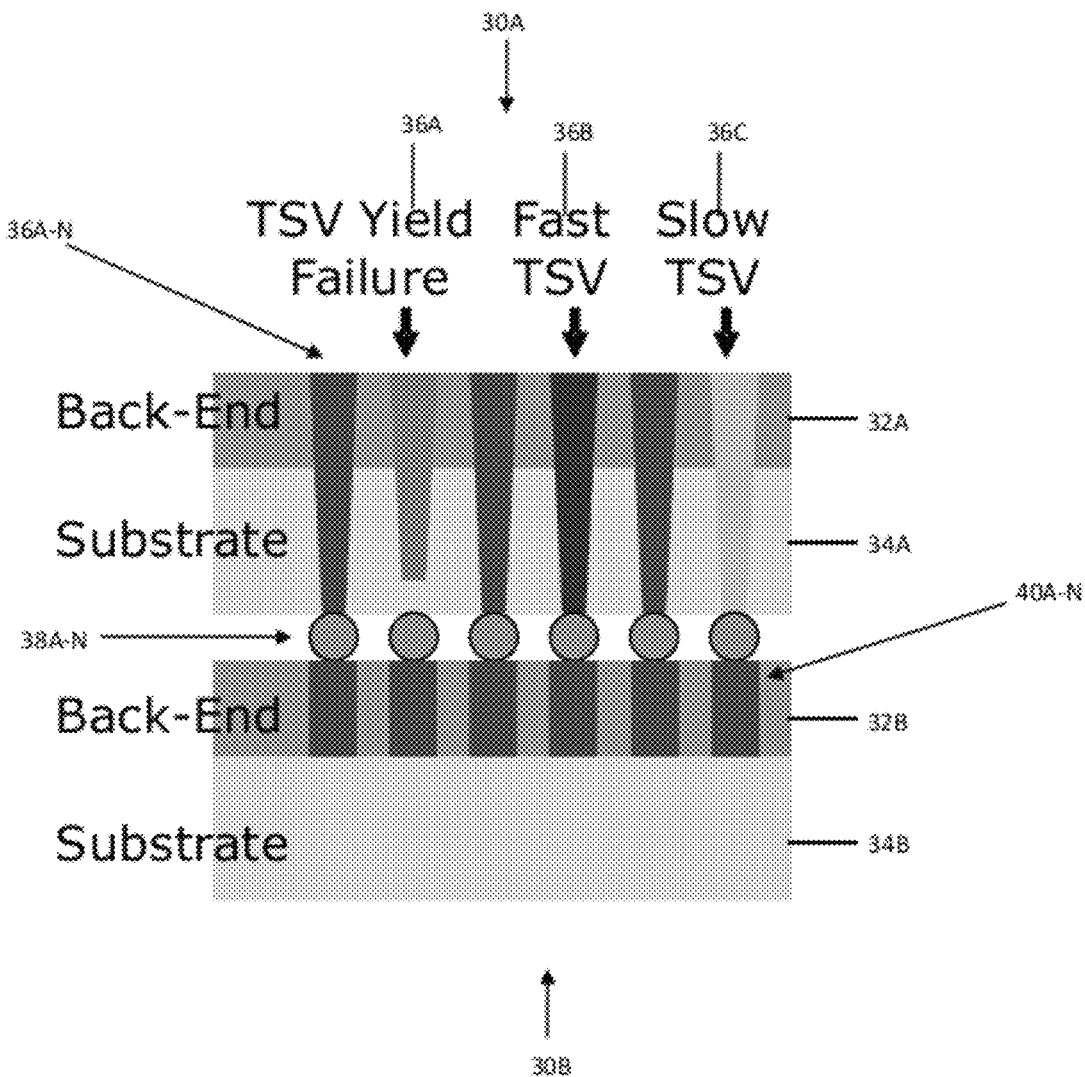
FIG. 3 depicts typical TSV failures that are addressed by the aspects of the present invention.

Such potential TSV failure is shown in greater detail in FIG. 3. Specifically, similar to FIG. 1, chip packages 30A-B each comprise a backend layer (backend metal interconnect layer) 32A-B, and a substrate (e.g., silicon) 34A-B. As further shown, chip package 30A includes a set of TSVs 36A-N extending from a top surface of backend layer 32A through substrate 34A. Similar to FIG. 1, opposing TSVs 36A-B on chip package 30B are vias 40A-B. Under such a configuration, with no TSV redundancy, TSVs 36A-N can have varying performance. For example, TSV 36A has failed, TSV 36B is fast, while TSV 36C is slow. Such inconsistency low product yield.

To address these issues, embodiments of the present invention provide multiple approaches for improved reliability and yield. Specifically, as will be shown below, embodiments of the present invention provide a network organizer positioned within the substrate of each chip package and/or redundant interconnects (e.g., backend side interconnects with or without the use of TSVs). These approaches provide improved performance/reliability and chip package yield.

II. Self-Organizing Network

A chip package produced in accordance with the present invention can include a network organizer or the like. Under such an embodiment, a network organizer can be provided at each chip (also referred to herein as chip package). In a typical embodiment, the network organizer(s) handle/manage care of all communications through TSVs. Any network organizer(s) shown in the following Figs. can have some or all of the functionality described above. Along these lines, the quantity of TSVs could be in the similar range as conventional design. More TSVs would produce better power-bandwidth performance and yield against failure. In addition, intra chip communication is encapsulated and handed over through TSV by a network organizer. Still yet, the intra chip TSV network is self-organized, can identify TSV failures as well as slow/fast TSVs, and can balance data load and data rate of TSVs.

Figure 4:
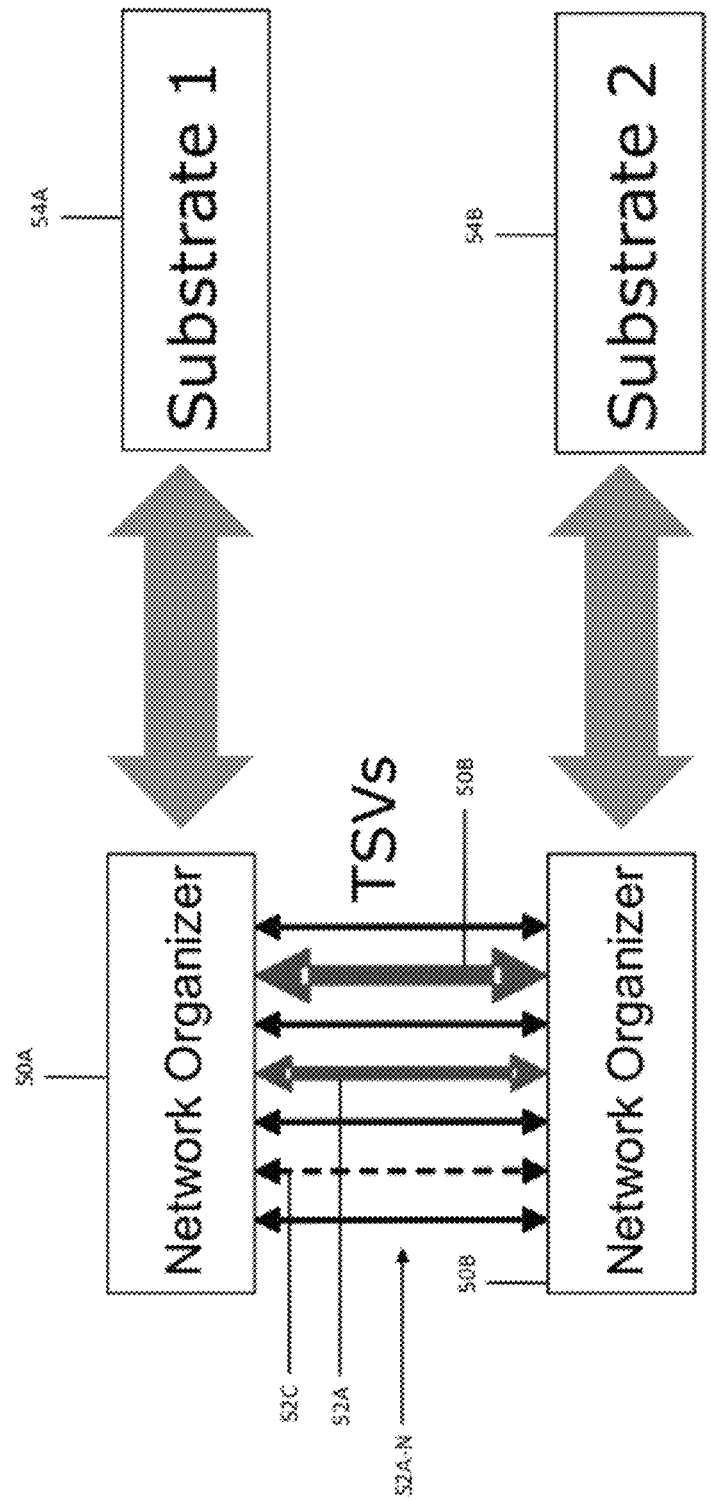
FIG. 4 depicts a self-organizing TSV network diagram according to an aspect of the present invention.

Referring now to FIG. 4, these network organizer concepts are shown in greater detail. As shown, network organizers 50A-B are typically positions within substrates 54A-B of chip packages. As indicated above, network organizers 50A-B manage communications (e.g., bandwidth) occurring through TSVs 52A-N. Thus, more load can be communicated through faster TSVs 52A-B than through slower TSV 52C. (It is noted that varying line width and texture for TSVs 52A-c of FIG. 4 indicates varying levels of TSV performance.) In a typical embodiment, network organizers 50A-B account for TSVs with performance evaluations. This is so that substrate-based communications are encapsulated through organizer.

As for functionality, network organizers 50A-B run TSV check-ups regularly (and keep records). They also generate and enforce power-bandwidth plans to adjust TSV load balances optimally against required data throughput. Along these lines, TSV-chip-package yield is based on power vs. bandwidth specification(s). Moreover, real-time re-balancing against aging and environment change (temperature, sudden failure, accumulated failure, etc.) can be provided.

Figure 5:
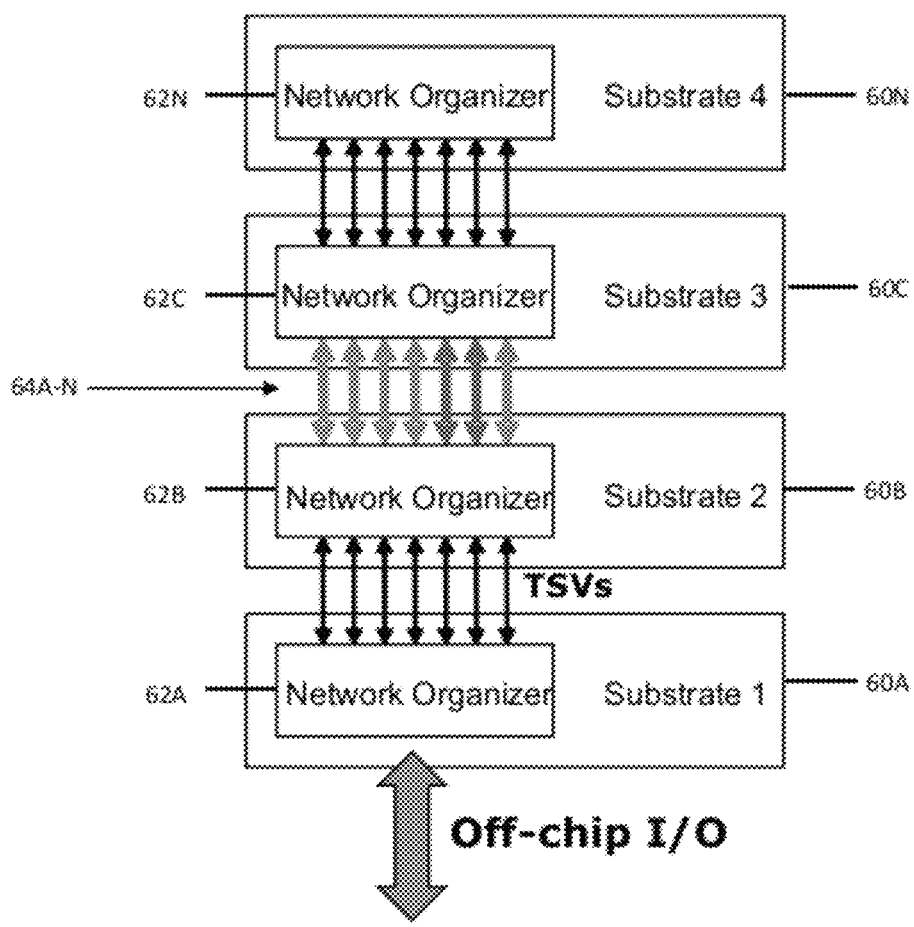
FIG. 5 depicts chip stacking with redundant TSVs and self/network organizers according to an aspect of the present invention.

Referring now to FIG. 5, the use of network organizers in a stacked chip environment is shown. As shown, substrates 60A-N are provided, each having a network organizer 62A-N positioned therein. As described above, network organizers 62A-N manage communications occurring between substrates 60A-N by way of TSVs 64A-N. Network organizers 62A-N allow for varying levels of performance by TSVs 64A-N to be counteracted through the use of network and load balancing so that consistent performance and/or yield can be provided. In a typical embodiment, network organizers 60A-N attempt to push additional bandwidth using valid TSVs within any applicable power budget.

III. Redundant Interconnections

The following section will describe the use of specific interconnection configurations to improve chip yield, performance and reliability. It is understood in advance, that any of the embodiments shown in FIGS. 6A-9 may or may not include the use of a network organizer as described above. They have been depicted herein to illustrate the full functionality capable under the embodiments of the present invention.

A. Backend Side Interconnects

Figure 6A:
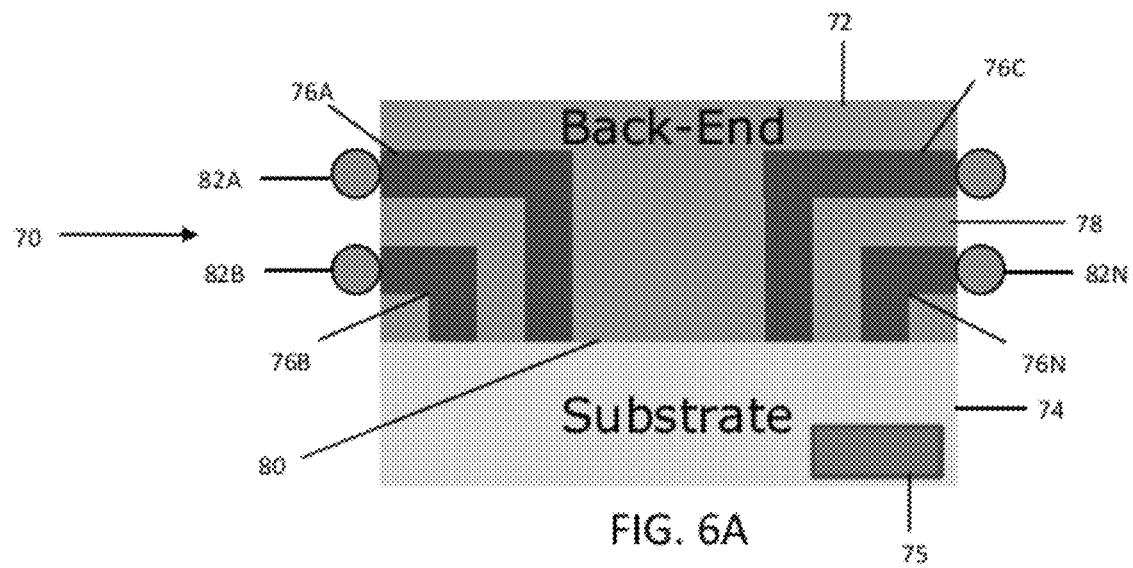
FIG. 6A depicts a chip package having extended backend side interconnects according to an aspect of the present invention.
Figure 6B:
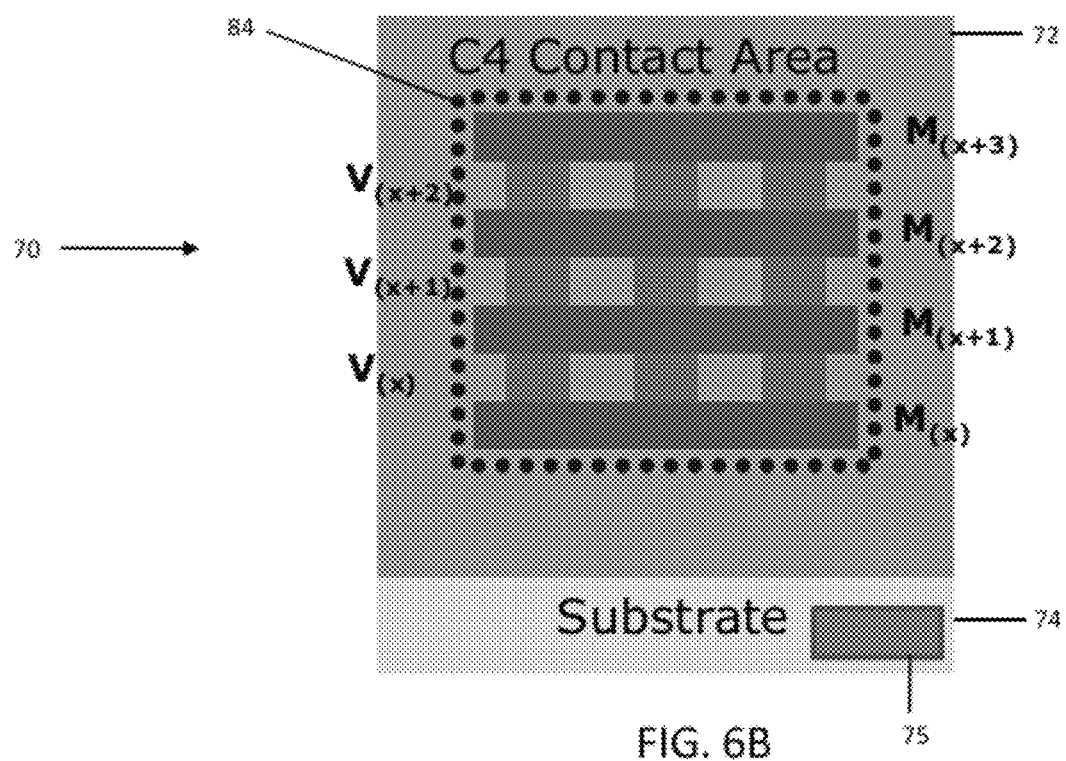
FIG. 6B shows C4 contact areas for the chip package of FIG. 6A according to an aspect of the present invention.

Under additional embodiments of the present invention, increased reliability and functionality can be provided through the use of additional interconnect configurations. Specifically, an additional embodiment of the present invention provides a chip package having backend side interconnects such as those shown in FIGS. 6A-B. Along these lines, FIG. 6A depicts a chip package 70 comprising backend layer (backend metal interconnect layer) 72, substrate 74 having a network organizer 75 coupled to backend layer 72. As further shown, backend layer has backend metal interconnects 76A-N extending (e.g., angularly) from a side surface 78 of backend layer 72 through a bottom surface 80 of backend layer 72. Under such embodiments, any quantity of backend metal interconnects 76A-N can be provided. Moreover, a set of C4s 82A-N can be positioned along side surface 78, adjacent set of backend side interconnects 76A-N. Set of C4s 82A-N function to couple chip package 70 to at least one other hardware element such as another chip package, a bus, etc. FIG. 6B shows C4 contact area 84 for chip package 70 of FIG. 6A according to an aspect of the present invention. As shown, contact area 84 can be a grid-like in configuration. This allows for maximum surface usage of chip package 70.

Figure 7A:
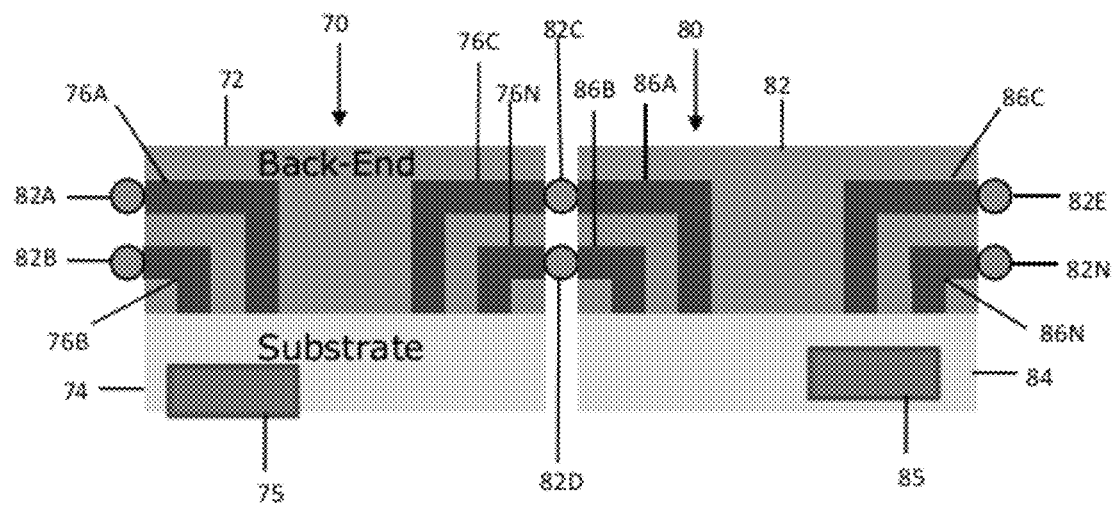
FIG. 7A shows 2D extension of a chip package via a set of backend side interconnects according to an aspect of the present invention.
Figure 7B:
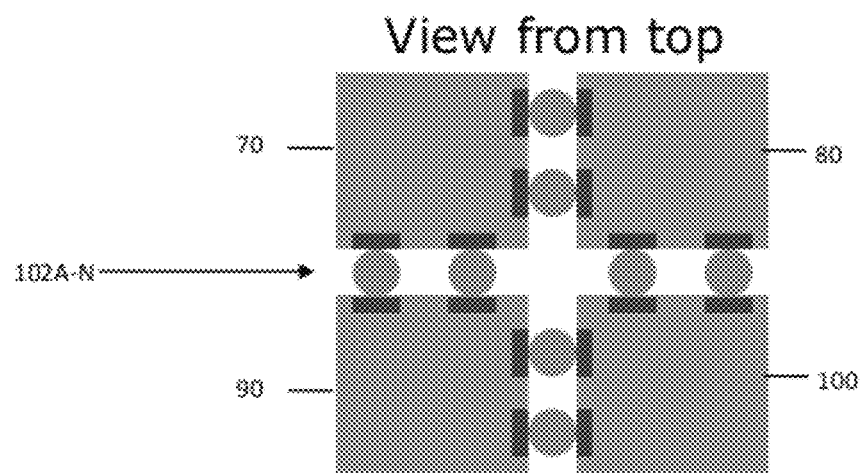
FIG. 7B shows a top view of the chip package of FIG. 7A according to an aspect of the present invention.
Figure 7C:
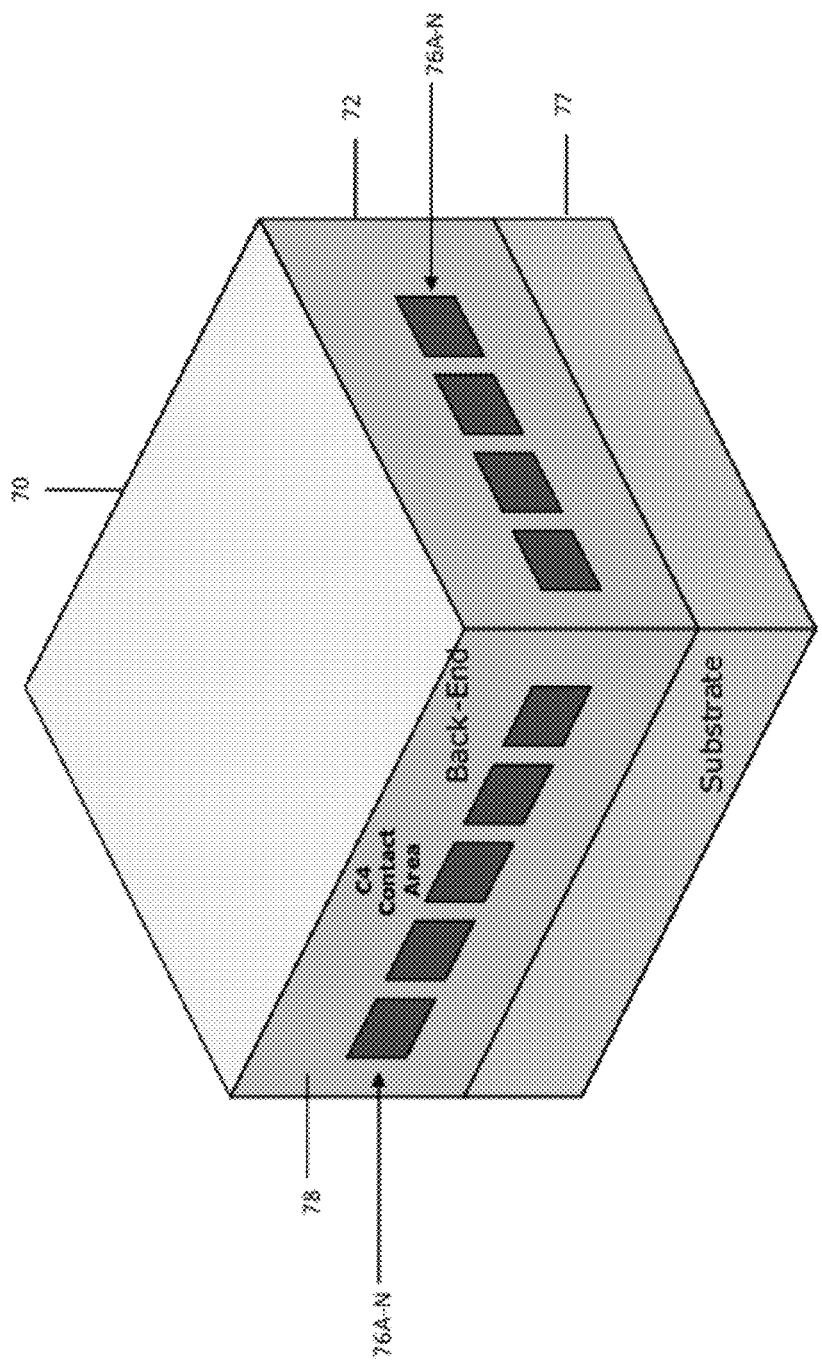
FIG. 7C shows a 3D view of the chip package of FIGS. 7A-B according to an aspect of the present invention.

Referring to FIGS. 7A-C these concepts are illustrated in greater detail. Specifically, FIG. 7A shows 2D extension of a chip package via a backend side interconnects according to an aspect of the present invention. FIG. 7B shows a top view of the chip package of FIG. 7A according to an aspect of the present invention. FIG. 7C shows a 3D view of the chip package of FIGS. 7A-B according to an aspect of the present invention. Referring first to FIG. 7A, two chip packages 70 and 80 are shown. Chip packages 70 and 80 each comprise a backend layer 72 and 82, a substrate 74 and 84 having network organizers 75 and 85 coupled to the backend layer 72 and 82, and a set of backend side interconnects 76A-N and 86A-N, respectively. As further shown, backend side C4s 82A-N can be provided adjacent to any of the backend side interconnects 76A-N and 86A-N. Such C4s 82A-N allow chip packages 70 and 80 to be coupled to one another in the fashion shown. As depicted in FIG. 7B, these concepts can continue to be applied for any quantity of chip packages. As shown, chip packages 70, 80, 90, and 100 are coupled to one another via C4s 102A-N. This type of arrangement allows for infinite scalability and redundancy. FIG. 7C shows a 3D view of chip package 70. As shown, any quantity of backend side interconnects 76A-N can be provided about side surfaces/walls 78 of backend layer 72, with each interconnect 76A-N forming a potential C4 contact area.

B. Hybrid TSVs

Figure 8:
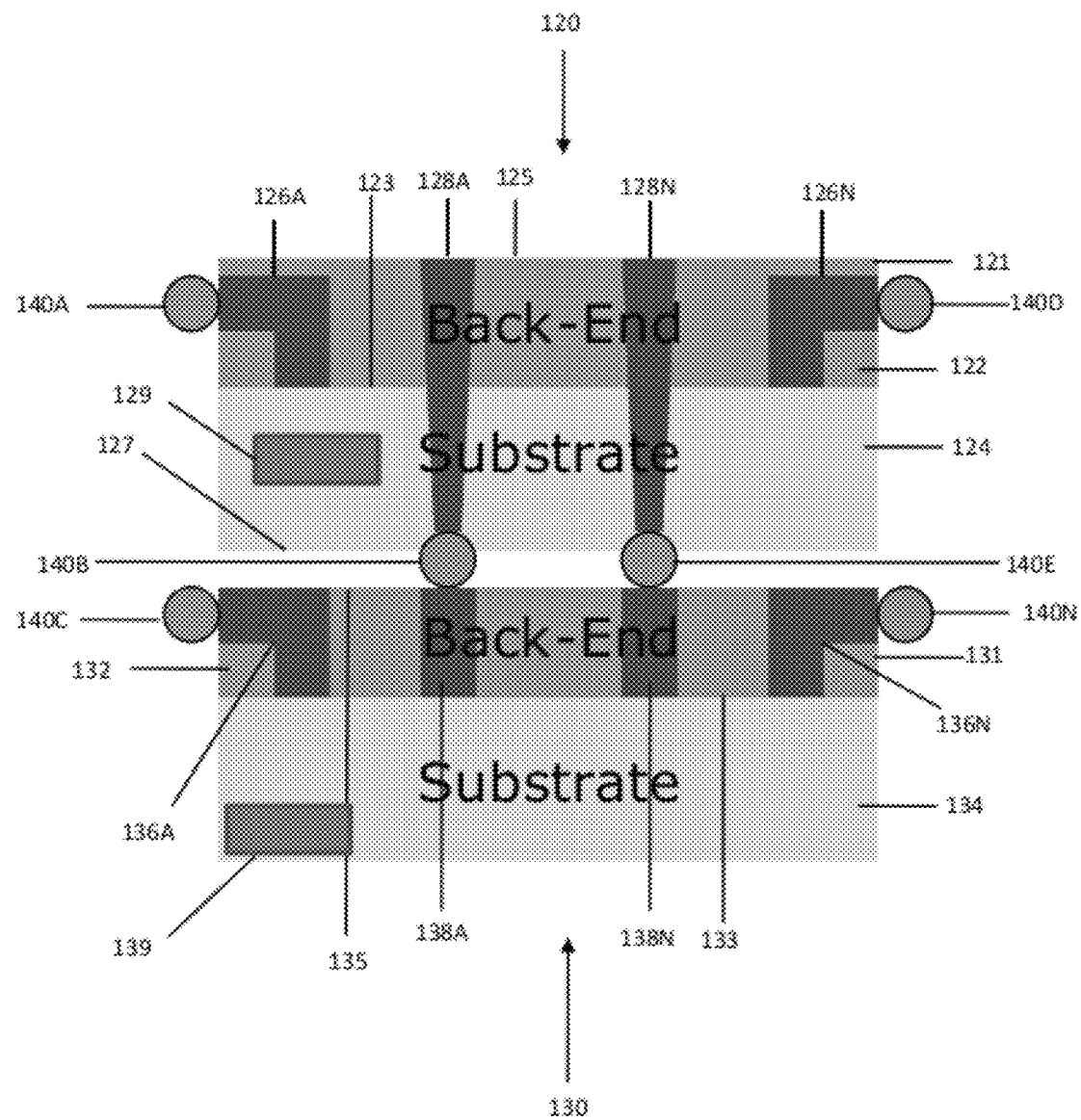
FIG. 8 shows a chip package having hybrid interconnects/TSVs according to an aspect of the present invention.

FIG. 8 shows a chip package 120 having hybrid interconnects/TSVs according to an aspect of the present invention. As shown, chip package 120 comprises backend layer (backend metal interconnect layer) 122 coupled to a substrate 124 having a network organizer 129. As further shown, chip package 120 further includes: a set of backend side interconnects 126A-N extending (e.g., angularly) from a side surface 121 of backend layer 122 to a bottom surface 123 of backend layer 122; and a set of vertical TSVs 128A-N extending from a top surface 125 of backend layer 122 through the substrate 124 (e.g., to a bottom surface thereof 127). FIG. 8 further shows another chip package 130 comprising a backend layer 132 coupled to a substrate 134 having network organizer 139, as well as backend side interconnects 146A-N extending (e.g., angularly) from a side surface 131 of backend layer 132 to a bottom surface 133 of backend layer 132. As further shown, chip package 130 can comprise a set of backend top/vertical vias/interconnects 138A-N extending from top surface 135 of backend layer 132 to bottom surface 133 of backend layer 132. Although not shown, backend top vias/interconnects 138A-N could be vertical TSVs that extend through substrate 134. Regardless, as further shown C4s 140A-N can be provided to allow coupling of chip package 120 to chip package 130 (as well as other hardware elements/devices not shown). Thus, the use of both backend side interconnects and vertical TSVs on a chip package 120 allow for maximum surface area use of chip package as well as increased reliability, yield, and performance.

Figure 9:
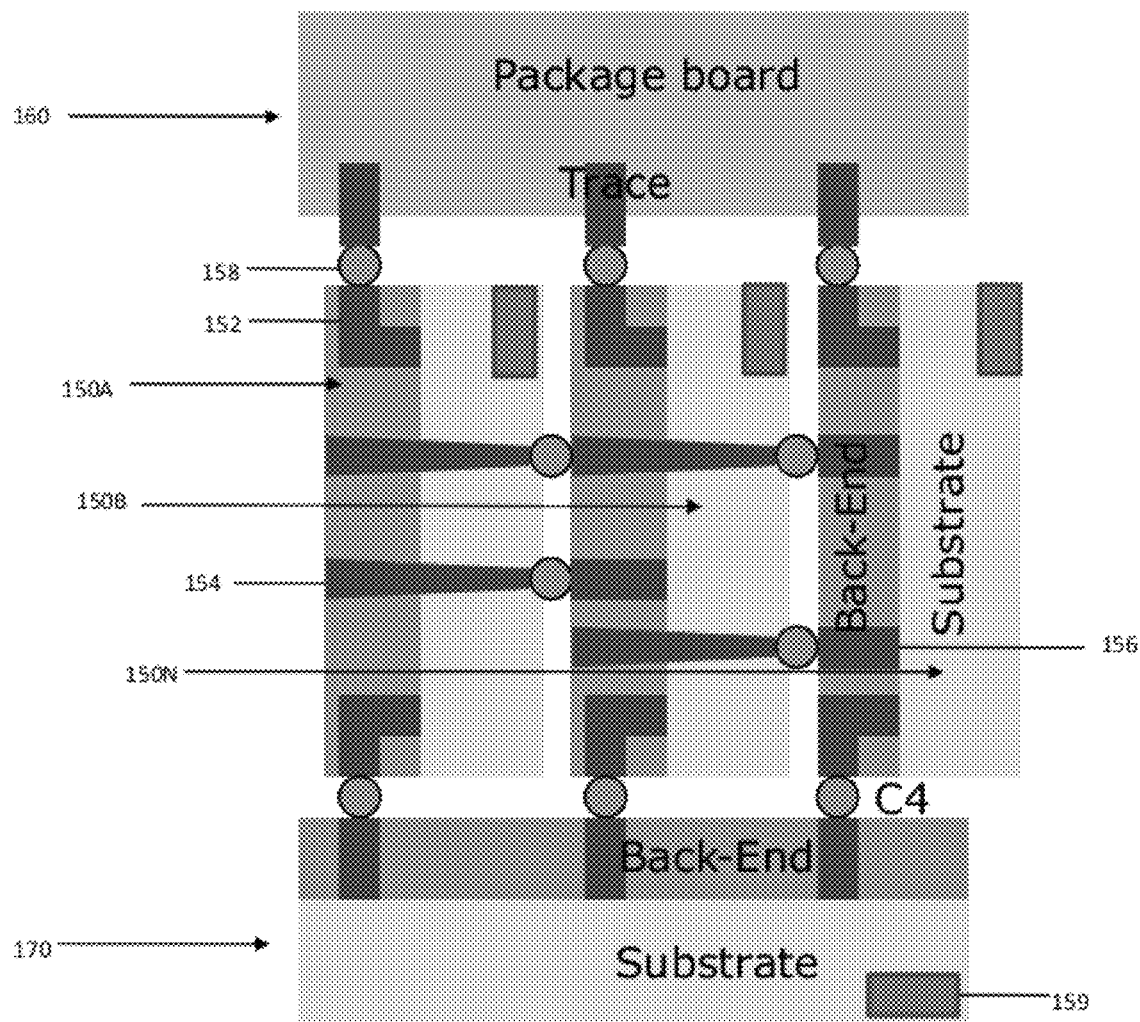
FIG. 9 shows a blade-like integration using the hybrid approach of FIG. 8 according to an aspect of the present invention.

Referring now to FIG. 9, a blade-like integration using the hybrid approach of FIG. 8 according to an aspect of the present invention is shown. As depicted, a set of chip packages 150A-N can be stacked and coupled to one another by implementing: a set of backend side interconnects such as 152, a set of vertical TSVs such as 154, a set of backend top interconnects such as 156 via C4s such as 158, and/or a set of network organizers such as 159. Such features not only allow chip packages 150A-N to be coupled to one another, but also to other hardware elements such as a package board 160 and/or another chip package 170.

Figure 10:
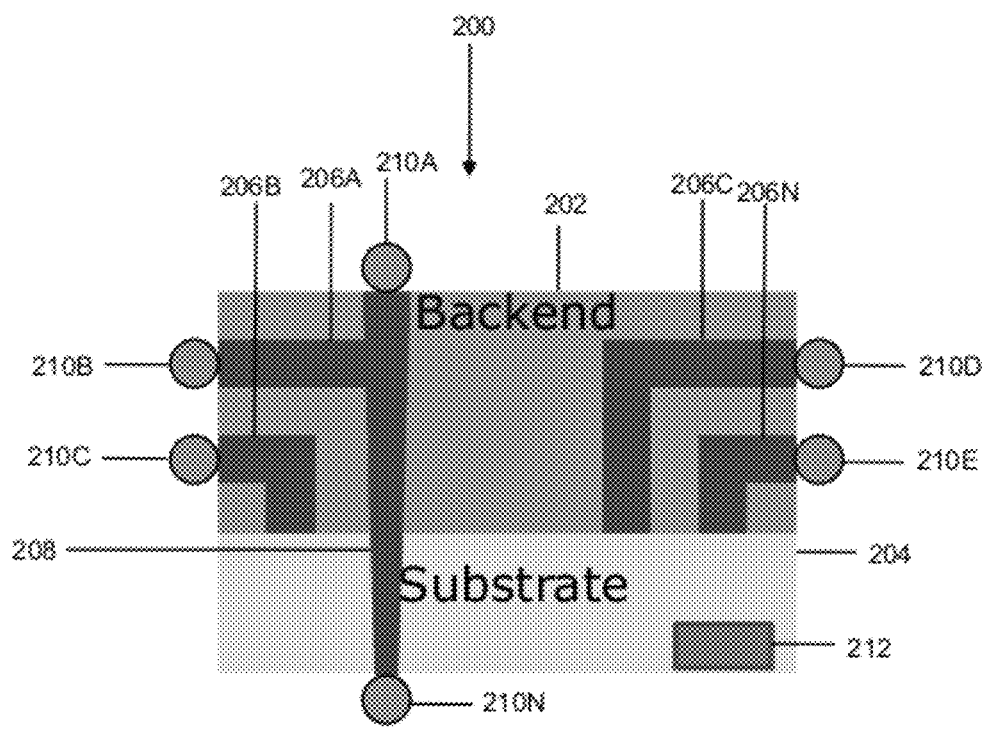
FIG. 10 depicts a chip package having interconnecting TSVs and hybrid backend interconnects according to an aspect of the present invention The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

Although FIG. 8 shows a chip package 120 that has backend side interconnects 126A-N and TSVs 128A-N that do not intersect/interconnect, this need not be the case. For example, referring to FIG. 10, a chip package 200 is shown. As depicted, chip package 200 comprises backend 202, substrate 204 having network organizer 212, backend side interconnects 206A-N, TSV 210A, and C4 interconnects 210A-N. It is understood that although FIG. 10 depicts a single TSV 208, this need not be the case. Rather any quantity could be utilized, a single TSV 208 is shown simply for brevity purposes. Regardless, as shown, TSV 208 intersects/interconnects with backend side interconnect 206A. This can provide improved inter/intra device communications, reliability, and yield.

It is understood that the concepts described in conjunction with FIGS. 1-9 could be implemented with many types of hardware elements such as memory elements, heterogeneous hybrid systems, multi-core processors, etc. Many benefits can be provided. Is general, these embodiments allow for: better memory chip yield from smaller chip size; lower parasitic capacitance than wire bonding; wider memory bandwidth (e.g., by having horizontal connections to package, and by having low-capacitance and low-inductance inter-chip connection); and/or no additional processing to be needed compared with TSVs.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A chip package comprising:
   a first chip comprising:
      a first backend layer,
      a first substrate coupled to the first backend layer,
      a first set of backend side interconnects angularly extending continually between a side surface of the first backend layer to terminate at a bottom surface of the first backend layer, wherein the bottom surface of the first backend layer is substantially perpendicular to the side surface of the first backend layer, wherein a top surface of the first backend layer substantially covers a top surface of the set of backend side interconnects,
      a first set of controlled collapse chip connections (C4s) positioned along the side surface of the first backend layer, adjacent to the first set of backend side interconnects, disposed for coupling the chip package to a hardware element, and
      a first set of vertical through silicon vias (TSVs) extending from the top surface of the first backend layer into a bottom surface of the first substrate; and
   a second chip comprising:
      a second backend layer,
      a second substrate coupled to the second backend layer,
      a second set of backend side interconnects angularly extending continually between a side surface of the second backend layer to terminate at a bottom surface of the second backend layer, wherein the bottom surface of the second backend layer is substantially perpendicular to the side surface of the second backend layer, wherein the second set of backend side interconnects is flush with a top surface of the second backend layer, a second set of controlled collapse chip connections (C4s) positioned along the side surface of the second backend layer, adjacent to the second set of backend side interconnects, and a second set of vertical through silicon vias (TSVs) extending from a top surface of the second backend layer to terminate at a bottom surface of the second backend layer.

2. The chip package of claim 1, further comprising a second set of C4s positioned along the first substrate, adjacent the set of vertical TSVs.

3. The chip package of claim 2, the second set of C4s being for coupling the chip package to another chip package.

4. The chip package of claim 1, further comprising;

a first network organizer for handling communications made using the first set of backend side interconnects and the first set of vertical TSVs; and a second network organizer for handling communications made using the second set of backend side interconnects and the second set of vertical TSVs.

5. The chip package of claim 4, the first network organizer being positioned in the first substrate, and the second network organizer being positioned in the second substrate.

6. The chip package of claim 2, further comprising a second set of C4s positioned along the side surface of the first backend layer, adjacent to the first set of backend side interconnects.

7. The chip package of claim 1, wherein the first backend layer and the first substrate are separate layers from one another; and wherein the second backend layer and the second substrate are separate layers from one another.

8. The chip package of claim 1, wherein the first set of vertical TSVs extending from the first backend layer into the first substrate extend further from a top surface of the first backend layer to a bottom surface of the first substrate.

* * * * *

UNITED STATES PATENT AND TRADEMARK OFFICE
CERTIFICATE OF CORRECTION

| | | |
|---|---|---|
| PATENT NO. | : 9,190,371 B2 | Page 1 of 1 |
| APPLICATION NO. | : 12/974165 | |
| DATED | : November 17, 2015 | |
| INVENTOR(S) | : Moon J. Kim | |

It is certified that error appears in the above-identified patent and that said Letters Patent is hereby corrected as shown below:

In the specification

Column 4, Line 23, after "invention", please insert --.--; and

In the claims

Column 8, line 59, Claim 1, after "layer", please delete "to".

Signed and Sealed this
Eighth Day of March, 2016

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 9,190,371 B2 | |
| APPLICATION NO. | : 12/974165 | |
| DATED | : November 17, 2015 | |
| INVENTOR(S) | : Moon J. Kim | |

It is certified that error appears in the above-identified patent and that said Letters Patent is hereby corrected as shown below:

In the specification

Column 4, Line 23, after "invention", please insert --.--; and

In the claims

Column 8, line 59, Claim 1, after "layer", please delete "in".

This certificate supersedes the Certificate of Correction issued March 8, 2016.

Signed and Sealed this
Third Day of May, 2016

Michelle K. Lee
*Director of the United States Patent and Trademark Office*